United States Patent [19]
Kwon

[11] Patent Number: 5,369,402
[45] Date of Patent: Nov. 29, 1994

[54] DIGITAL/ANALOG CONVERTER CIRCUIT UTILIZING COMPENSATION CIRCUITRY

[75] Inventor: Oh B. Kwon, Bubaleub, Ichonkun, Rep. of Korea

[73] Assignee: Hyundai Electronics Industries Co., Ltd., Bubaleub, Rep. of Korea

[21] Appl. No.: 173,397

[22] Filed: Dec. 23, 1993

[30] Foreign Application Priority Data

Dec. 31, 1992 [KR] Rep. of Korea ............... 1992-27324

[51] Int. Cl.5 .................................. H03M 1/66
[52] U.S. Cl. .................. 341/136; 341/118; 341/144
[58] Field of Search ............ 341/136, 119, 118, 120, 341/121, 144; 307/310, 491, 501; 330/264

[56] References Cited

U.S. PATENT DOCUMENTS

| | | | |
|---|---|---|---|
| 4,766,415 | 8/1988 | Dielacher | 341/119 |
| 4,800,365 | 1/1989 | White et al. | 341/119 |
| 5,148,065 | 9/1994 | Krenik et al. | 307/572 |

*Primary Examiner*—Brian K. Young
*Attorney, Agent, or Firm*—Darby & Darby

[57] ABSTRACT

A digital/analog converter circuit comprising first to third transistors, the first transistor having a gate terminal for inputting a constant voltage and one side terminal for inputting a power source voltage, the second transistor having a gate terminal for inputting a first digital signal, one side terminal connected to the other side terminal of the first transistor and the other side terminal forming a first output terminal, the third transistor having a gate terminal for inputting a second digital signal of the opposite phase to that of the first digital signal, one side terminal connected to the other side terminal of the first transistor and the other side terminal forming a second output terminal. A buffer part buffers a digital input signal to provide the second digital signal. An inverter part inverts the digital input signal to provide the first digital signal. The inverter part includes a first compensator for removing an input transfer time difference between the second and third transistors in response to the output of the buffer part. A second compensator removes floating electrons from the inverter part in response to the digital input signal. A third compensator compensates for a poor "0" logical state transfer capability of the buffer part in response to the output of the inverter part.

6 Claims, 3 Drawing Sheets (PRIROR ART)

DIGITAL/ANALOG CONVERTER CIRCUIT UTILIZING COMPENSATION CIRCUITRY

BACKGROUND OF THE INVENTION

1. Field of the Invention

The present invention relates in general to digital/analog converter circuits for converting digital signals into analog signals, and more particularly to a digital/analog converter circuit using a current switching manner with the same signal transfer time with respect to devices in the circuit.

2. Description of the Prior Art

Generally, digital information can readily be processed, and must be converted into analog information so that it can easily be recognized. To this end, a digital/analog converter circuit is used to convert the digital information into the analog information. The digital/analog converter circuit may generally be applied to the process of audio and video signals and a control system based on an analog value. The digital/analog converter circuit is required to have a high speed processing ability and a high precision, particularly in the video signal process application.

In a conventional digital/analog converter circuit, an input digital signal is converted into a discrete control signal by a decoder. The discrete control signal remains at its present state until the subsequent digital signal is inputted, resulting in output of successive analog signal values.

Referring to FIG. 1, there is shown a circuit diagram of a conventional digital/analog converter circuit of the segment drive type. As shown in this drawing, the conventional digital/analog converter circuit comprises a transistor M1 having a gate terminal for inputting a constant voltage Vref1 and a source terminal for inputting a power source voltage Vaa. As a result, the transistor M1 is operated as a saturation current source. A constant voltage Vref2 is applied to a gate terminal of a transistor M3, whereas a digital input signal Di1 is applied to a gate terminal of a transistor M2. As a result, the transistors M2 and M3 are switched to the opposite states according to a state of the digital input signal Di1.

However, in the above-mentioned conventional digital/analog converter circuit of FIG. 1, a voltage at an output node n1 of the transistor M1 is shaken within a certain range because the signal flow of the transistor M2 is controlled by only the digital input. This is a barrier to the improvement in a switching speed.

Referring to FIG. 2, there is shown a circuit diagram of another conventional digital/analog converter circuit of the segment drive type, which has been made in view of the above problem with the conventional digital/analog converter circuit of FIG. 1. As shown in this drawing, the conventional digital/analog converter circuit comprises an inverter I1 for inverting the digital input signal Di1 and applying the inverted digital input signal to the gate terminal of the transistor M3. The use of the inverter I1 causes the digital signals of the opposite logical levels to be applied to the gate terminals of the transistors M2 and M3. This has the effect of preventing the voltage variation at the node n1.

However, in the above-mentioned conventional digital/analog converter circuit of FIG. 2, the digital signals of the opposite logical levels are not arrived simultaneously at the gate terminals of the transistors M2 and M3. As a result, the transistors M2 and M3 may simultaneously be turned on or off, resulting in generation of a glitch signal. The generation of the glitch signal results in a delay in a signal conversion speed.

SUMMARY OF THE INVENTION

Therefore, the present invention has been made in view of the above problems, and it is an object of the present invention to provide a digital/analog converter circuit which has a high speed processing ability and a high precision suitably to the process of a video signal and a random access memory.

In accordance with the present invention, the above and other objects can be accomplished by a provision of a digital/analog converter circuit comprising first to third transistors, said first transistor having a gate terminal for inputting a constant voltage and one side terminal for inputting a power source voltage, said second transistor having a gate terminal for inputting a first digital signal, one side terminal connected to the other side terminal of said first transistor and the other side terminal forming a first output terminal, said third transistor having a gate terminal for inputting a second digital signal of the opposite phase to that of the first digital signal, one side terminal connected to the other side terminal of said first transistor and the other side terminal forming a second output terminal, wherein the improvement comprises buffer means for buffering a digital input signal and applying the buffered digital input signal as the second digital signal to the gate terminal of said third transistor; inverter means for inverting the digital input signal and applying the inverted digital input signal as the first digital signal to the gate terminal of said second transistor, said inverter means having first compensating means, said first compensating means removing an input transfer time difference between said second and third transistors in response to the buffered digital input signal from said buffer means; second compensating means for removing floating electrons from said inverter means in response to the digital input signal; and third compensating means for compensating for a poor "0" logical state transfer capability of said buffer means in response to the inverted digital input signal from said inverter means.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION OF THE PREFERRED EMBODIMENT

Figure 1:
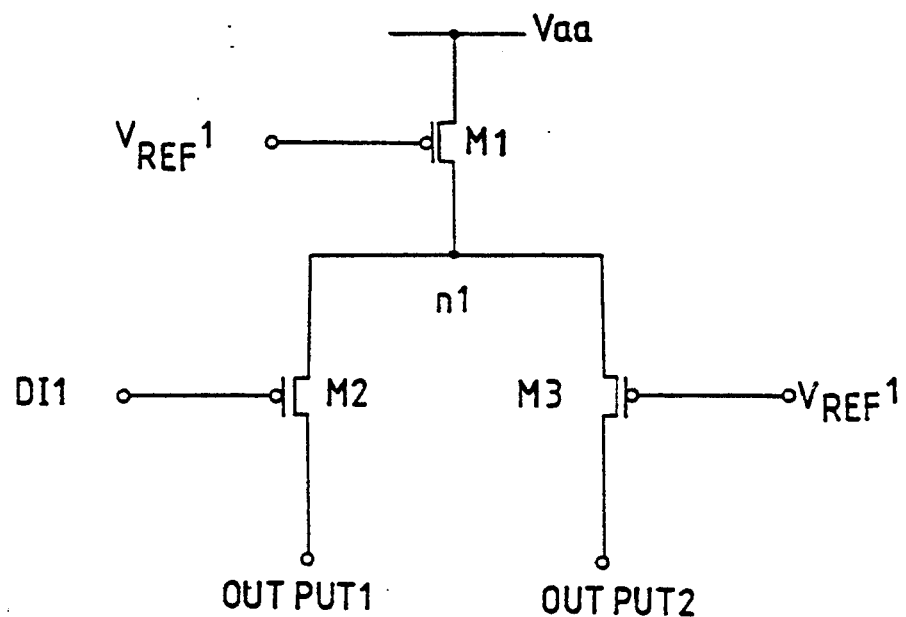
FIG. 1 is a circuit diagram of a conventional digital/analog converter circuit.
Figure 2:
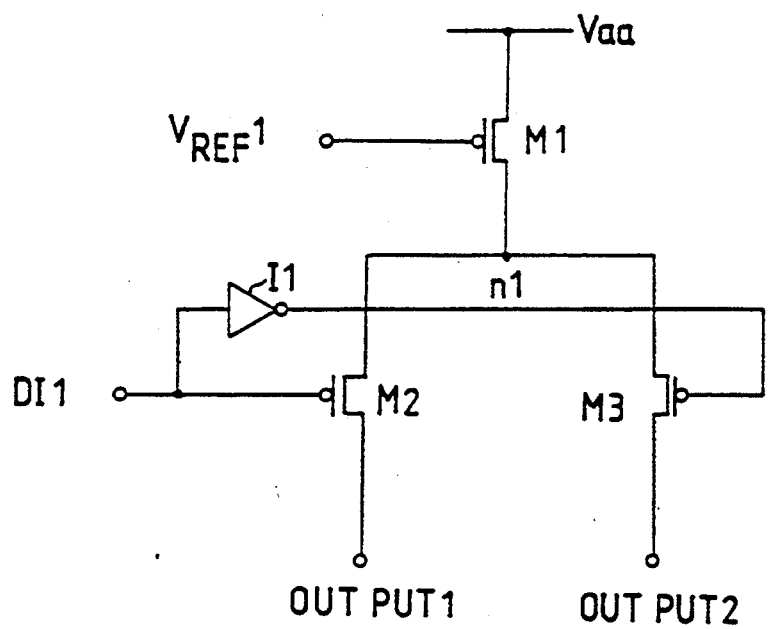
FIG. 2 is a circuit diagram of another conventional digital/analog converter circuit.
Figure 3A:
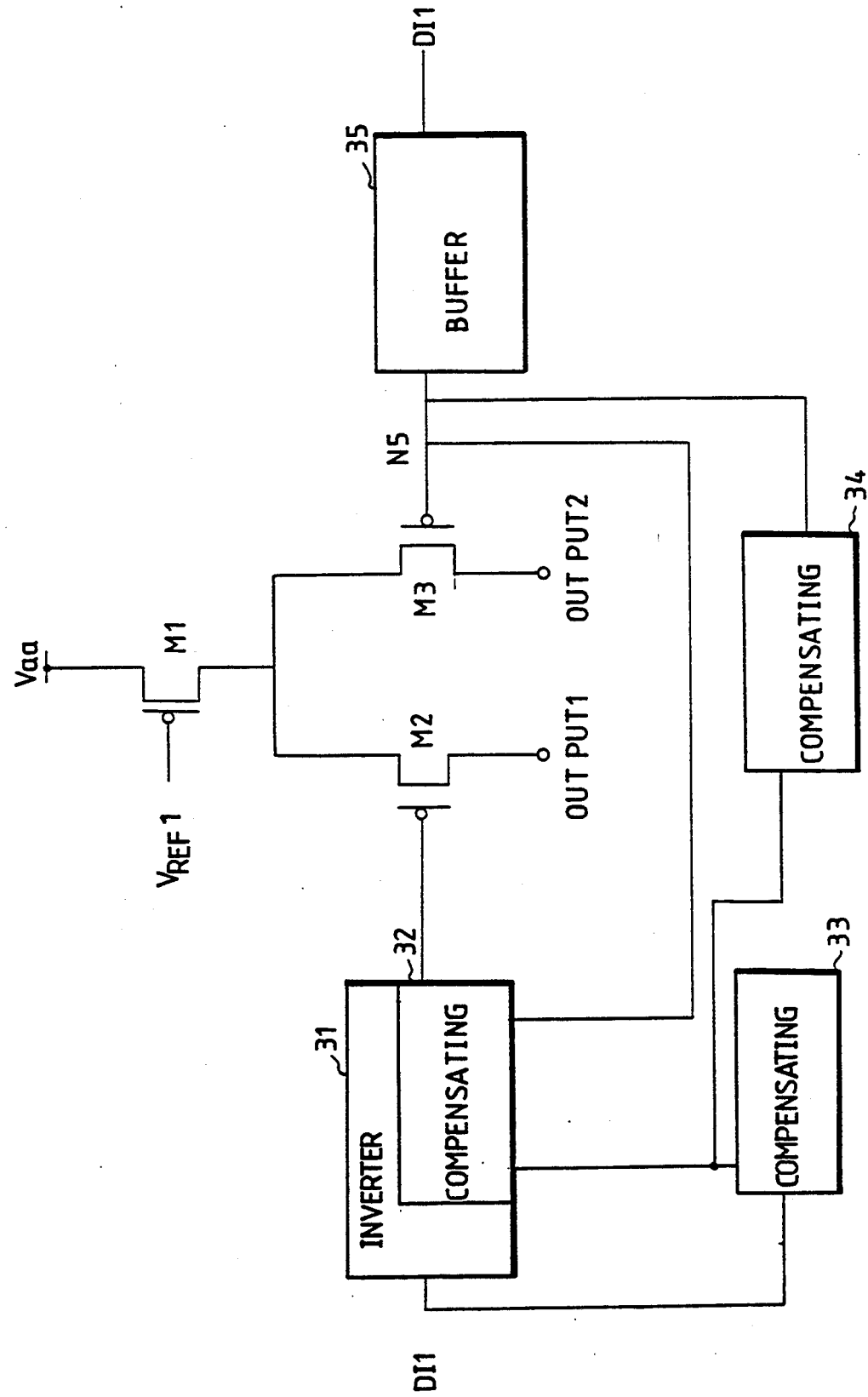
FIG. 3A is a block diagram of a digital/analog converter circuit in accordance with the present invention.

Referring to FIG. 3A, there is shown a block diagram of a digital/analog converter circuit in accordance with the present invention. Some of parts in this drawing are the same as those in FIGS. 1 and 2. Therefore, like reference numerals designate like parts.

As shown in FIG. 3A, the digital/analog converter circuit comprises the P-channel transistors M1-M3 similarly to the conventional digital/analog converter circuit. The constant voltage Vref1 is applied to the gate terminal of the P-channel transistor M1 and the power source voltage Vaa is applied to the source terminal of the P-channel transistor M1. As a result, the P-channel transistor M1 is operated as the saturation current source. A digital signal is applied to the gate terminal of the P-channel transistor M2. Also, the P-channel transistor M2 has a source terminal connected to a drain terminal of the P-channel transistor M1. A digital signal is applied to the gate terminal of the P-channel transistor M3. The digital signals applied to the gates of the P-channel transistors M2 and M3 have the opposite phases. Also, the P-channel transistor M3 has a source terminal connected to the drain terminal of the P-channel transistor M1. Drain terminals of the P-channel transistors M2 and M3 form output terminals 1 and 2, respectively.

Hence, current flows to only one of the output terminals 1 and 2 according to logical states of the gate input signals of the P-channel transistors M2 and M3.

Buffer and inverter means 35 and 31 are provided in the digital/analog converter circuit to generate the output at only one of the P-channel transistors M2 and M3. The buffer means 35 buffers the digital input signal Di1 and applies the buffered digital input signal to the gate terminal of the P-channel transistor M3. The inverter means 31 inverts the digital input signal Di1 and applies the inverted digital input signal to the gate terminal of the P-channel transistor M2.

The inverter means 31 includes compensating means 32 for removing an input transfer time difference between the P-channel transistors M2 and M3 in response to the buffered digital input signal from the buffer means 35.

Compensating means 33 is also provided in the digital/analog converter circuit to remove floating electrons from the inverter means 31 in response to the digital input signal Di1.

Compensating means 34 is also provided in the digital/analog converter circuit to compensate for a poor "0" logical state transfer capability of the buffer means 35 in response to the inverted digital input signal from the inverter means 31.

The plurality of means as mentioned above will hereinafter be described in detail with reference to FIG. 3B which is a detailed circuit diagram of the digital/analog converter circuit.

Figure 3B:
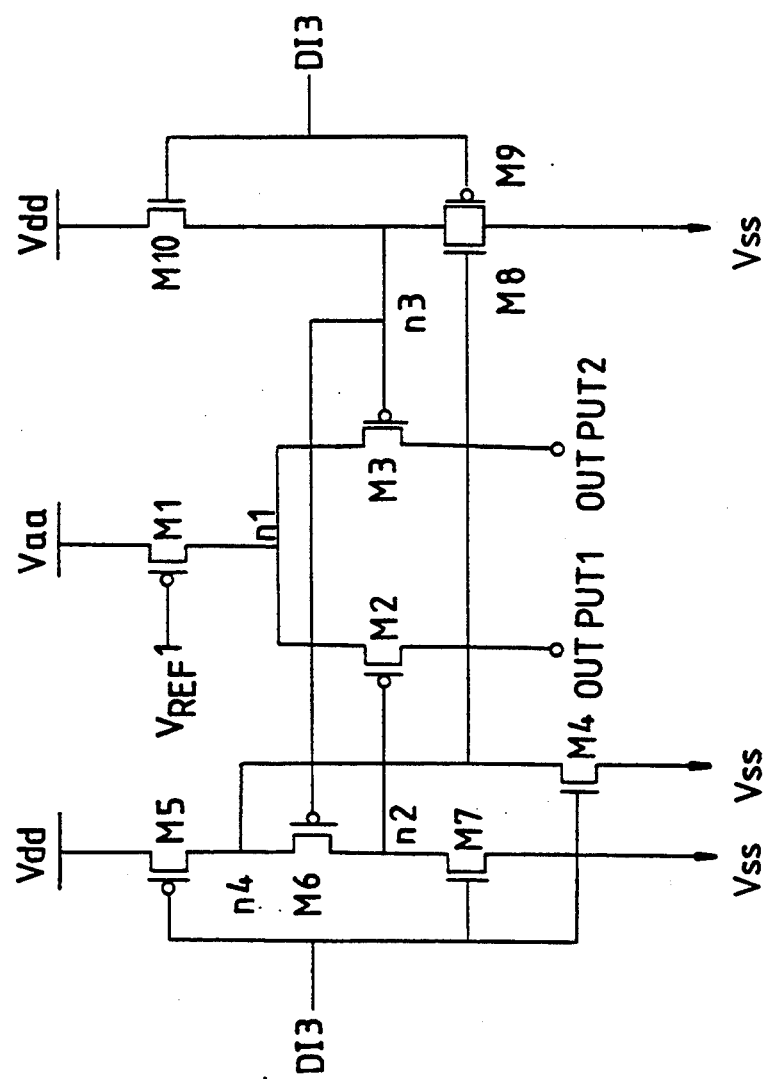
FIG. 3B is a detailed circuit diagram of the digital/analog converter circuit in FIG. 3A.

As shown in FIG. 3B, the buffer means 35 includes a N-channel transistor M10 and a P-channel transistor M9. The N-channel transistor M10 has a gate terminal for inputting the digital input signal Di1 and a drain terminal connected to a power supply terminal Vdd. The P-channel transistor M9 has a gate terminal for inputting the digital input signal Di1, a source terminal connected to a source terminal of the N-channel transistor M10 and a drain terminal connected to a ground terminal Vss. With this construction, when the digital input signal Di1 is "high", the N-channel transistor M10 is turned on, thereby causing a high signal to be applied to the gate terminal of the P-channel transistor M3.

The inverter means 31 includes a P-channel transistor M5 and a N-channel transistor M7. The P-channel transistor M5 has a gate terminal for inputting the digital input signal Di1 and a source terminal connected to the power supply terminal Vdd. The N-channel transistor M7 has a gate terminal for inputting the digital input signal Di1, a drain terminal connected to a drain terminal of the P-channel transistor M5 and a source terminal connected to the ground terminal Vss. With this construction, when the digital signal Di1 is "low", the P-channel transistor M5 is turned on, thereby causing a high signal to be applied to the gate terminal of the P-channel transistor M2. On the contrary, when the digital signal Di1 is "high", the P-channel transistor M5 is turned off, thereby causing a low signal to be applied to the gate terminal of the P-channel transistor M2.

Therefore, since the outputs of the inverter and buffer means 31 and 35 always have the opposite phases, the current flows to only one of the output terminals 1 and 2.

The compensating means 34 includes a N-channel transistor M8. The N-channel transistor M8 has a gate terminal for inputting the inverted digital input signal from the inverter means 31, a source terminal connected to the drain terminal of the P-channel transistor M9 in the buffer means 35 and a drain terminal connected to the source terminal of the P-channel transistor M9. With this construction, the N-channel transistor M8 compensates for the poor "0" logical state transfer capability of the P-channel transistor M9.

The compensating means 32 includes a P-channel transistor M6. The P-channel transistor M8 is connected between the drain terminals of the P-channel transistor M6 and N-channel transistor M7 in the inverter means 31 to input the buffered digital input signal from the buffer means 35 at its gate terminal. With this construction, the P-channel transistor M6 removes the input transfer time difference between the P-channel transistors M2 and M3.

The compensating means 33 includes a N-channel transistor M4. The N-channel transistor M4 has a drain terminal connected to a drain terminal of the P-channel transistor M6 in the compensating means 32, a gate terminal for inputting the digital input signal Di1 and a source terminal connected to the ground terminal Vss. At that time that the digital input signal Di1 goes from "high" to "low", the electron floating takes place at a node between the P-channel transistors M5 and M6. At this time, the N-channel transistor M4 causes the floating electrons to rapidly flow to the ground terminal Vss, resulting in the removal of the floating electrons.

As apparent from the above description, according to the present invention, the digital/analog converter circuit can have the high speed processing ability and the high precision. This has the effect of enhancing the video processing ability.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A digital/analog converter circuit comprising first to third transistors, said first transistor having a gate terminal for inputting a constant voltage and one side terminal for inputting a power source voltage, said second transistor having a gate terminal for inputting a first digital signal, one side terminal connected to the other side terminal of said first transistor and the other side terminal forming a first output terminal, said third transistor having a gate terminal for inputting a second digital signal of the opposite phase to that of the first digital signal, one side terminal connected to the other side terminal of said first transistor and the other side terminal forming a second output terminal, wherein the improvement comprises:

buffer means for buffering a digital input signal and applying the buffered digital input signal as the second digital signal to the gate terminal of said third transistor;

inverter means for inverting the digital input signal and applying the inverted digital input signal as the first digital signal to the gate terminal of said second transistor, said inverter means having first compensating means, said first compensating means removing an input transfer time difference between said second and third transistors in response to the buffered digital input signal from said buffer means;

second compensating means for removing floating electrons from said inverter means in response to the digital input signal; and third compensating means for compensating for a poor "0" logical state transfer capability of said buffer means in response to the inverted digital input signal from said inverter means.

2. A digital/analog converter circuit as set forth in claim 1, wherein said buffer means includes:

a first N-channel transistor, said first N-channel transistor having a gate terminal for inputting the digital input signal and a drain terminal connected to a power supply terminal; and a P-channel transistor, said P-channel transistor having a gate terminal for inputting the digital input signal, a source terminal connected to a source terminal of said first N-channel transistor and a drain terminal connected to a ground terminal.

3. A digital/analog converter circuit as set forth in claim 1, wherein said inverter means includes:

a first P-channel transistor, said first P-channel transistor having a gate terminal for inputting the digital input signal and a source terminal connected to a power supply terminal; and a first N-channel transistor, said N-channel transistor having a gate terminal for inputting the digital input signal, a drain terminal connected to a drain terminal of said first P-channel transistor and a source terminal connected to a ground terminal.

4. A digital/analog converter circuit as set forth in claim 2, wherein said third compensating means includes:

a second N-channel transistor, said second N-channel transistor having a gate terminal for inputting the inverted digital input signal from said inverter means, a source terminal connected to the drain terminal of said P-channel transistor in said buffer means and a drain terminal connected to the source terminal of said P-channel transistor in said buffer means.

5. A digital/analog converter circuit as set forth in claim 3, wherein said first compensating means includes:

a second P-channel transistor, said second P-channel transistor being connected between the drain terminals of said first P-channel transistor and said first N-channel transistor in said inverter means to input the buffered digital input signal from said buffer means at its gate terminal.

6. A digital/analog converter circuit as set forth in claim 5, wherein said second compensating means includes:

a second N-channel transistor, said second N-channel transistor having a drain terminal connected to a drain terminal of said second P-channel transistor in said first compensating means, a gate terminal for inputting the digital input signal and a source terminal connected to the ground terminal.

* * * * *